United States Patent
Tai et al.

(10) Patent No.: US 8,809,923 B2
(45) Date of Patent: Aug. 19, 2014

(54) BACKSIDE ILLUMINATED IMAGING SENSOR HAVING A CARRIER SUBSTRATE AND A REDISTRIBUTION LAYER

(75) Inventors: Hsin-Chih Tai, Cupertino, CA (US); Howard E. Rhodes, San Martin, CA (US); Duli Mao, Sunnyvale, CA (US); Vincent Venezia, Sunnyvale, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/027,222

(22) Filed: Feb. 6, 2008

(65) Prior Publication Data
US 2009/0194798 A1    Aug. 6, 2009

(51) Int. Cl.
*H01L 31/062* (2012.01)
*H01L 31/113* (2006.01)
*H01L 31/00* (2006.01)
*H01L 27/146* (2006.01)

(52) U.S. Cl.
CPC .... *H01L 27/14618* (2013.01); *H01L 27/14636* (2013.01); *H01L 27/14687* (2013.01)
USPC ........... 257/292; 257/291; 257/448; 257/459; 257/E27.129

(58) Field of Classification Search
CPC .................. H01L 27/14643; H01L 27/14636; H01L 27/14687; H01L 2224/48227; H01L 27/14618
USPC ................. 257/291, 292, 441–448, 458–641, 257/E27.129; 250/214.1, 370.11
See application file for complete search history.

(56) References Cited

U.S. PATENT DOCUMENTS

| | | | |
|---|---|---|---|
| 4,961,821 A | 10/1990 | Drake et al. | |
| 6,429,036 B1 | 8/2002 | Nixon et al. | |
| 6,867,123 B2 | 3/2005 | Katagiri et al. | |
| 6,933,489 B2 * | 8/2005 | Fujii et al. | 250/214.1 |
| 7,067,354 B2 | 6/2006 | Prabhu | |
| 7,091,124 B2 | 8/2006 | Rigg et al. | |
| 7,531,443 B2 * | 5/2009 | Pratt | 438/618 |

(Continued)

FOREIGN PATENT DOCUMENTS

EP           1 648 036 A1    4/2006
WO    WO 2007/103224 A2    9/2007

OTHER PUBLICATIONS

"Radiometric Performance Enhancement of Hybrid and Monolithic Backside Illuminated CMOS APS for Space-borne Imaging," Bogaerts, J. et al., In Proc. 2007 International Image Sensor Workshop, Ogunquit Maine, USA Jun. 7-10, 2007, pp. 151-154.

(Continued)

*Primary Examiner* — Shouxiang Hu
(74) *Attorney, Agent, or Firm* — Blakely Sokoloff Taylor & Zafman LLP (57) ABSTRACT

A backside illuminated imaging sensor includes a semiconductor substrate having a front surface and a back surface. The semiconductor substrate has at least one imaging array formed on the front surface. The imaging sensor also includes a carrier substrate to provide structural support to the semiconductor substrate, where the carrier substrate has a first surface coupled to the front surface of the semiconductor substrate. A re-distribution layer is formed between the front surface of the semiconductor substrate and the second surface of the carrier substrate to route electrical signals between the imaging array and a second surface of the carrier substrate.

8 Claims, 8 Drawing Sheets

(56) References Cited

U.S. PATENT DOCUMENTS

| | | | |
|---|---|---|---|
| 2006/0076590 | A1 | 4/2006 | Pain et al. |
| 2006/0281215 | A1* | 12/2006 | Maruyama et al. ............. 438/57 |
| 2007/0018263 | A1 | 1/2007 | Noma |
| 2007/0052050 | A1 | 3/2007 | Dierickx |
| 2007/0194401 | A1* | 8/2007 | Nagai et al. ................... 257/447 |
| 2007/0259463 | A1 | 11/2007 | Abedini |

OTHER PUBLICATIONS

"Wafer-Level Thinned Monolithic CMOS Imagers in a Bulk-CMOS Technology," Pain, B. et al., In Proc. 2007 International Image Sensor Workshop, Ogunquit Maine, USA Jun. 7-10, 2007, pp. 158-161.

"Back-Illuminated, Three-Dimensionally Integrated CMOS Imager with In-Pixel CDS," Suntharalingam, V. et al., In Proc. 2007 International Image Sensor Workshop, Ogunquit Maine, USA Jun. 7-10, 2007, pp. 155-157.

PCT/US2008/088250—PCT International Search Report and Written Opinion of the International Searching Authority, dated Jun. 23, 2009.

TW 098101270—Taiwanese Office Action, issued May 22, 2013, with English Translation (15 pages).

CN 200880126380.6—Chinese Office Action, issued Oct. 23, 2012, with English Translation (11 pages).

EP 08872211.1—European Office Action, issued Mar. 2, 2012 (4 pages).

CN 200880126380.6—Chinese Office Action, issued Feb. 29, 2012, with English Translation (16 pages).

* cited by examiner

BACKSIDE ILLUMINATED IMAGING SENSOR HAVING A CARRIER SUBSTRATE AND A REDISTRIBUTION LAYER

TECHNICAL FIELD

This disclosure relates generally to backside illuminated image sensors, and in particular but not exclusively, relates to backside illuminated image sensors having a carrier wafer and a redistribution layer.

BACKGROUND INFORMATION

Many semiconductor imaging sensors today are front side illuminated. That is, they include imaging arrays that are fabricated on the front side of a semiconductor wafer, where light is received at the imaging array from the same front side. The electrical contacts for the imaging arrays are also fabricated on the front side of the wafer. Thus, the electrical contacts for these front side illuminated devices are typically routed out through the side for connecting to bump pads or other bonding elements on the back side of the sensor.

Figure 1A:
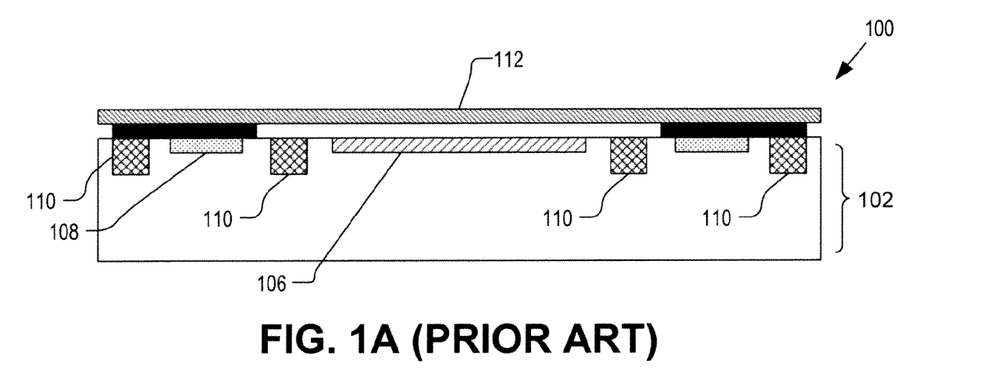
FIGS. 1A-1E illustrate cross-sectional views of a prior art imaging sensor and a method of making the same.
Figure 1B:
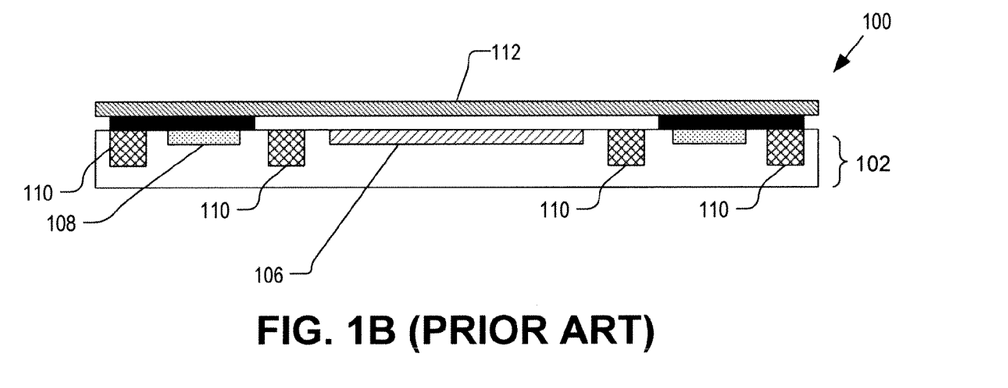
Figure 1C:
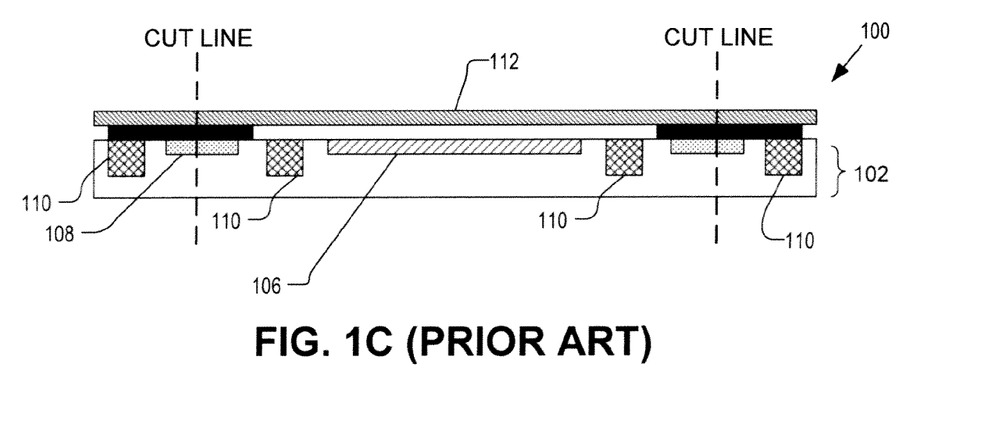
Figure 1D:
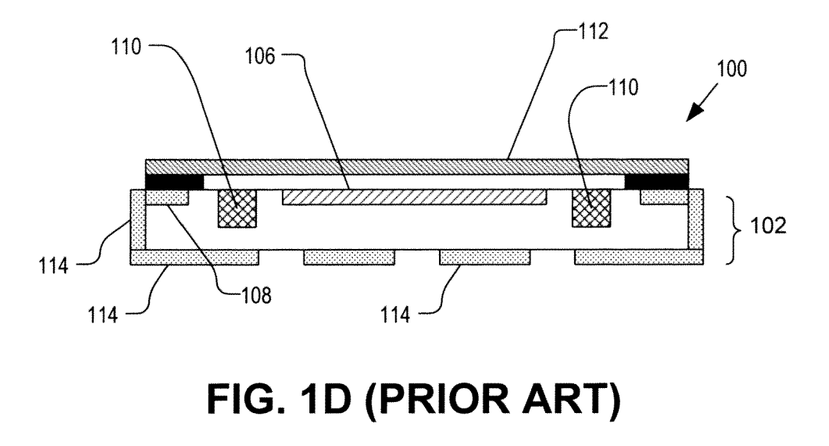
Figure 1E:
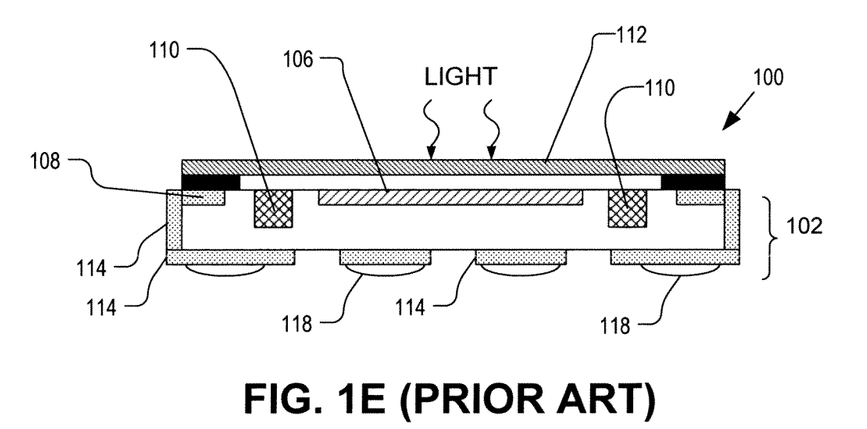

For example, FIGS. 1A-1E illustrate cross-sectional views of a prior art imaging sensor 100 and a method of making the same. Imaging sensor 100 is illustrated as including a semiconductor wafer 102 and a light transparent later 104. In FIG. 1A, imaging array 106, metal pads 108 and multiple seal rings 110 are formed on the front side of wafer 102. A glass cover 112 may then be affixed to the front side of wafer 102. The back side of wafer 102 is then ground down in FIG. 1B. In FIG. 1C, wafer 102 is then cut through metal pads 108 in order to access the sidewall of sensor 100. FIG. 1D illustrates the forming of metal connections 114 on the sidewall and back side of sensor 100 in order to distribute the connections of imaging array 106 along the back side of sensor 100. Finally, in FIG. 1E, bump pads 118 are formed on the backside of sensor 100 in order to provide a bonding area for the sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Imaging Sensor having a Carrier Substrate and a Re-distribution Layer are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In short, embodiments of the present invention include a backside illuminated imaging sensor that includes a carrier substrate and a re-distribution layer. The carrier substrate provides structural support to the sensor and the re-distribution layer routes electrical signals between an imaging array and a bonding surface of the sensor on the front side of the device. The re-distribution layer may also be configured to distribute electrical connections of the sensor to areas above the imaging array in order to transform off-chip connections from chip scale to board scale and vice versa. These and other embodiments are described in detail below.

Figure 2A:
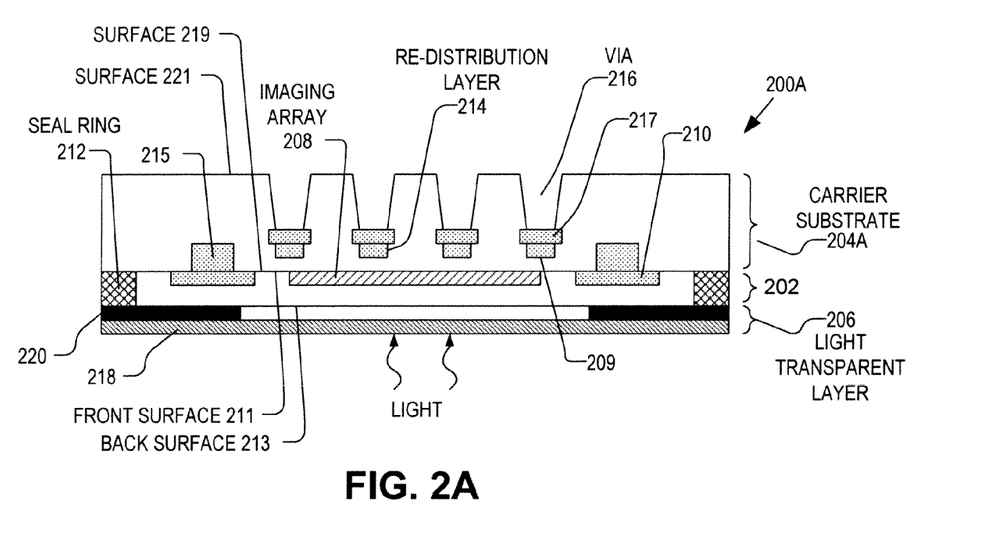
FIG. 2A is a cross-sectional view of a backside illuminated sensor with a re-distribution layer and vias formed in a carrier substrate, in accordance with an embodiment of the invention.

FIG. 2A is a cross-sectional view of a backside illuminated ("BSI") sensor 200A with a re-distribution layer 214 and vias 216 formed in a carrier substrate 204A, in accordance with an embodiment of the invention. The illustrated embodiment of BSI sensor 200A includes a semiconductor substrate 202, carrier substrate 204A, and a light transparent layer 206. Semiconductor substrate 202 is illustrated as having a front surface 211 and a back surface 213. Semiconductor substrate 202 is also shown as including an imaging array 208, peripheral circuitry 210, and a seal ring 212. Carrier substrate 204A is illustrated as having a first surface (i.e., surface 219) and a second surface (i.e., surface 221). FIG. 2A also shows carrier substrate 204A as including re-distribution layer 214, pad 215, vias 216 and pad 217. Light transparent layer 206 is illustrated as including glass layer 218 and adhesive 220.

In the illustrated embodiment of FIG. 2A, imaging array 208 is formed on front surface 211 of semiconductor substrate 202 and is configured to receive light from back surface 213. In one embodiment, imaging array 208 includes a plurality of active pixels that each uses four transistors, which is known in the art as a 4T active pixel arrangement. However, one of ordinary skill in the art given the benefit of this disclosure can appreciate that imaging array 208 of the present invention can be used with any type of pixel design, including but not limited to 3T, 5T, 6T, and other designs, as well as with CCD or CMOS image sensors.

In the 4T active pixel embodiment, each pixel includes a photosensitive element, which in one example is a pinned photodiode. However, the photosensitive element may be a photogate, photocapacitor, partially pinned photodiode, or unpinned photodiode. Furthermore, the term pixel as used herein is meant to encompass all pixel designs, including CCD pixels. The photodiode outputs a signal that is used to modulate an amplification transistor. The amplification transistor may also be referred to as a source follower transistor. A transfer transistor having a transfer gate is then used to transfer the signal output by the photodiode to a floating node and the gate of the amplification transistor.

In operation, during an integration period (also referred to as an exposure or accumulation period), the photodiode stores charge (in response to incident light received through back surface 213) that is held in a layer of the photodiode. After the integration period, the transfer gate is turned on to transfer the charge held in the photodiode layer to the floating node. After the signal has been transferred to the floating node, the transfer gate is turned off again for the start of a subsequent integration period. The signal on the floating node is then used to modulate the amplification transistor, which is readout by peripheral circuitry 210. Peripheral circuitry 210 may include amplifiers, filters, or other signal processing circuits. After readout, a reset transistor having a reset gate resets the floating node to a reference voltage. In one embodiment, the reference voltage is Vdd.

After imaging array 208 and peripheral circuitry 210 has been formed, a single seal ring 212 or other anchor structure is formed in or on an outer region of one or more of the dielectric layers of semiconductor substrate 202 in an outer edge region of the chip around the active devices. Conductive interconnects and dielectric layers of semiconductor substrate 202 may be susceptible to cracking and delaminating during die sawing or other processes employed to separate multiple chips formed on a wafer into individual chips or dies. Thus, seal ring 212 may protect the semiconductor devices (e.g., peripheral circuitry 210 and imaging array 208) from contaminants (e.g., sodium) and prevents stacked layers of conductive interconnects and insulating dielectric layers from cracking or delaminating, by providing stress relief.

The embodiment of FIG. 2A further illustrates light transparent layer 206 as including glass layer 218 affixed to the back surface 213 of semiconductor substrate 202 by way of adhesive 220. Although FIG. 2A illustrates glass layer 218, it is appreciated that glass layer 218 may be optionally omitted or that additional imaging components, such as color filters and lenses may be fabricated on and over back surface 213.

In the illustrated embodiment of FIG. 2A, carrier substrate 204A has a surface 219 that is coupled to the front surface 211 of semiconductor substrate 202 to provide structural support to semiconductor substrate 202. It is noted that the illustrated embodiment of BSI sensor 200A shown in FIG. 2A is not drawn to scale. For example, carrier substrate 204A may have a thickness that is much greater than that of semiconductor substrate 202. By way of example, carrier substrate 204A may be on the order of 100 times thicker than semiconductor substrate 202. In one embodiment, carrier substrate 204A and semiconductor substrate 202 are fabricated separately and then bonded together by a method such as press-bonding.

FIG. 2A illustrates re-distribution layer 214 as formed in carrier substrate 204A. One purpose of re-distribution layer 214 is to route electrical signals between imaging array 208 and surface 221 of carrier substrate 204A. For example, re-distribution layer 214 may receive image signals from imaging array 208 or peripheral circuitry 210 and route these signals to circuitry external to BSI sensor 200A for display, storage or further processing. In another example, re-distribution layer 214 may receive a control signal or power from external circuitry and route this control signal or power to peripheral circuitry 210 or imaging array 208.

In one embodiment, re-distribution layer 214 is a layer of metal patterned onto carrier substrate 204A. This layer of metal is illustrated in FIG. 2A as including metal traces 209 and metals pads 215. Metal pads 215 are formed to couple metal traces 209 to peripheral circuitry 210. Carrier substrate 204A is illustrated as further including vias 216 and metal pads 217. Metal pads 217 are formed in carrier substrate 204A to couple vias 216 to metal traces 209. In one embodiment metal pads 215, metal pads 217 and metal traces 209 are a metal such as tungsten or other alloy. In one embodiment, metal pads 215, metal pads 217 and metal traces 209 are deposited onto carrier substrate 204A by way of sputtering, collimated sputtering, low pressure sputtering, reactive sputtering, electroplating, chemical vapor deposition or evaporation.

In one embodiment, carrier substrate 204A is an oxide. In another embodiment, carrier substrate 204A is formed from silicon. In this embodiment of a silicon carrier substrate 204A, an insulator such as oxide, nitride or polymer may be fabricated between the metal and silicon. For example, a silicon carrier substrate 204A may include an oxide insulator formed between metal pads 217 and the silicon of carrier substrate 204A.

Vias 216 may be formed in carrier substrate 204A by way of various known methods of forming vias. For example, for a silicon carrier substrate 204A, vias 216 may be formed using a through silicon via (TSV) method. In another example, for an oxide carrier substrate 204A, vias 216 may be formed using a through oxide via (TOV) method. Vias 216 are fabricated into carrier substrate 204A to complete the routing of electrical signals between surface 221 and imaging array 208.

Thus, the carrier substrate 204A illustrated in the embodiment of FIG. 2A may provide several functions for BSI sensor 200A. One function of carrier substrate 204A is to provide structural support to semiconductor substrate 202. Another is to route electrical signals between imaging array 208 and surface 221. Yet another function of carrier substrate 204A is to re-distribute the electrical signals to different areas of BSI sensor 200A to maximize the surface area of the chip.

Figure 2B:
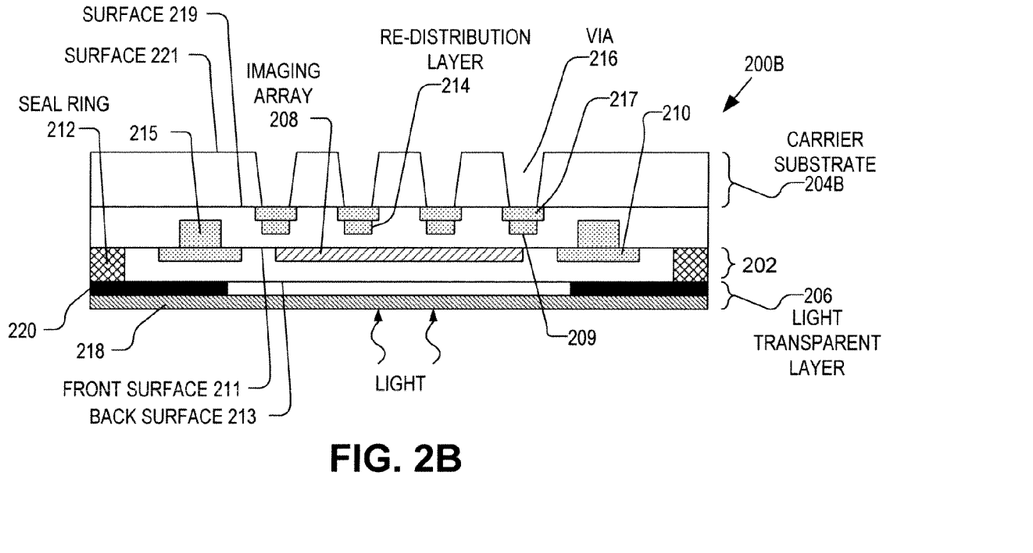
FIG. 2B is a cross-sectional view of a backside illuminated sensor with vias formed in a carrier substrate and a re-distribution layer formed on a semiconductor substrate, in accordance with an embodiment of the invention.

FIG. 2B is a cross-sectional view of a backside illuminated sensor 200B with vias 216 formed in a carrier substrate 204B and re-distribution layer 214 formed on semiconductor substrate 202, in accordance with an embodiment of the invention. Like numerals are used to represent like elements as described above with reference to FIG. 2A.

FIG. 2B illustrates re-distribution layer 214 as formed on the front surface 211 of semiconductor substrate 202. In one embodiment, redistribution layer 214 is a layer of metal patterned onto semiconductor substrate 202. This layer of metal is illustrated in FIG. 2B as including metal traces 209 and metals pads 215 and 217. Metal pads 215 are formed to couple metal traces 209 to peripheral circuitry 210 and metal pads 217 are formed to couple vias 216 to metal traces 209. In one embodiment, metal pads 215, metal pads 217 and metal traces 209 are deposited onto semiconductor substrate 202 by way of sputtering, collimated sputtering, low pressure sputtering, reactive sputtering, electroplating, chemical vapor deposition or evaporation.

In the embodiment of FIG. 2B, carrier substrate 204B is illustrated as including vias 216 and has a surface 219 that is coupled (through re-distribution layer 214) to the front surface 211 of semiconductor substrate 202 to provide structural support to semiconductor substrate 202. It is noted that the illustrated embodiment of BSI sensor 200B shown in FIG. 2B is not drawn to scale. For example, carrier substrate 204B may have a thickness that is much greater than that of semiconductor substrate 202. By way of example, carrier substrate 204B may be on the order of 100 times thicker than semiconductor substrate 202. In one embodiment, carrier substrate 204B and semiconductor substrate 202 are fabricated separately. In this embodiment, semiconductor substrate 202 is fabricated, then re-distribution layer 214 is formed onto the front surface 211 of semiconductor substrate 202. Carrier substrate 204B is then bonded to the top surface of the re-distribution layer 214 by a method such as press-bonding.

In one embodiment, carrier substrate 204B is an oxide. In another embodiment, carrier substrate 204B is formed from silicon. In this embodiment of a silicon carrier substrate 204B, an insulator such as oxide, nitride or polymer may be fabricated between the metal and silicon. For example, a silicon carrier substrate 204B may include an oxide insulator formed between metal used in vias 216 and the silicon of carrier substrate 204B. Vias 216 may be formed in carrier substrate 204B by way of various known methods of forming vias. For example, for a silicon carrier substrate 204B, vias 216 may be formed using a through silicon via (TSV) method. In another example, for an oxide carrier substrate 204B, vias 216 may be formed using a through oxide via (TOV) method. Vias 216 are fabricated into carrier substrate 204B to complete the routing of electrical signals between surface 221 and imaging array 208.

Figure 3A:
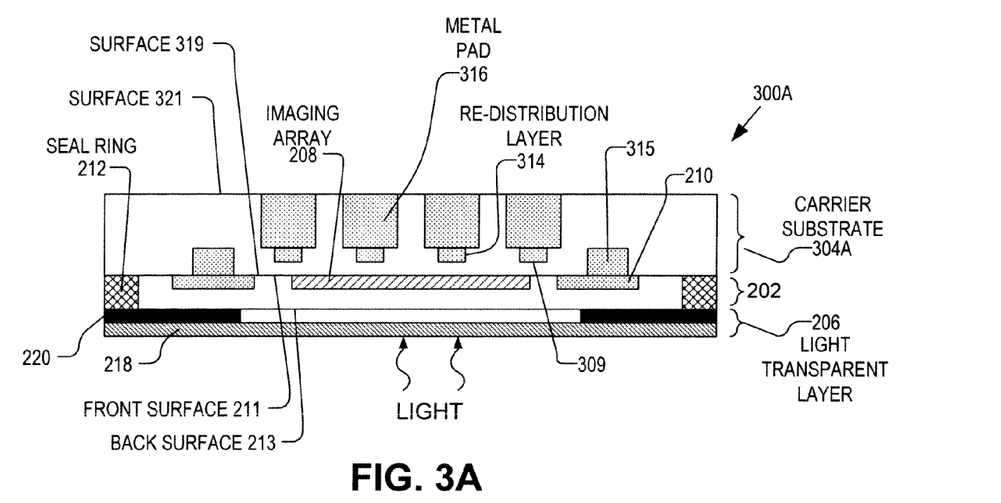
FIG. 3A is a cross-sectional view of a backside illuminated sensor with a re-distribution layer and metal pads formed in a carrier substrate, in accordance with an embodiment of the invention.

FIG. 3A is a cross-sectional view of a BSI sensor 300A with a re-distribution layer 314 and metal pads 316 formed in a carrier substrate 304A, in accordance with an embodiment of the invention. The illustrated embodiment of BSI sensor 300A includes semiconductor substrate 202, carrier substrate 304A, and light transparent layer 206. Carrier substrate 304A is illustrated as having a first surface (i.e., surface 319) and a second surface (i.e., surface 321). FIG. 3A also shows carrier substrate 304A as including re-distribution layer 314 and metal pads 315 and 316.

In the illustrated embodiment of FIG. 3A, carrier substrate 304A has a surface 319 that is coupled to the front surface 211 of semiconductor substrate 202 to provide structural support to semiconductor substrate 202. It is noted that the illustrated embodiment of BSI sensor 300A shown in FIG. 3A is not drawn to scale. For example, carrier substrate 304A may have a thickness that is much greater than that of semiconductor substrate 202. By way of example, carrier substrate 304A may be on the order of 100 times thicker than semiconductor substrate 202. In one embodiment, carrier substrate 304A and semiconductor substrate 202 are fabricated separately and then bonded together by a method such as press-bonding.

FIG. 3A illustrates re-distribution layer 314 as formed in carrier substrate 304A. One purpose of re-distribution layer 314 is to route electrical signals between imaging array 208 and surface 321 of carrier substrate 304A. For example, re-distribution layer 314 may receive image signals from imaging array 208 or peripheral circuitry 210 and route these signals to circuitry external to BSI sensor 300A for display, storage or further processing. In another example, re-distribution layer 314 may receive a control signal or power from external circuitry and route this control signal or power to peripheral circuitry 210 or imaging array 208.

In one embodiment, re-distribution layer 314 is a layer of metal patterned onto carrier substrate 304A. This layer of metal is illustrated in FIG. 3A as including metal traces 309 and metals pads 315. Metal pads 315 are formed to couple metal traces 309 to peripheral circuitry 210. Carrier substrate 304A is illustrated as further including metal pads 316. Metal pads 316 are formed in carrier substrate 304A to couple to metal traces 309 and to provide a bonding area for BSI sensor 300A at surface 321. In one embodiment metal pads 315, metal pads 316 and metal traces 309 are a metal such as tungsten or other alloy. In one embodiment, metal pads 315, metal pads 316 and metal traces 309 are deposited onto carrier substrate 304A by way of sputtering, collimated sputtering, low pressure sputtering, reactive sputtering, electroplating, chemical vapor deposition or evaporation.

In one embodiment, carrier substrate 304A is an oxide. In another embodiment, carrier substrate 304A is formed from silicon. In this embodiment of a silicon carrier substrate 304A, an insulator such as oxide, nitride or polymer may be fabricated between the metal and silicon. For example, a silicon carrier substrate 304A may include an oxide insulator formed between metal pads 316 and the silicon of carrier substrate 304A.

Thus, the carrier substrate 304A, illustrated in the embodiment of FIG. 3A may provide several functions for BSI sensor 300A. One function of carrier substrate 304A is to provide structural support to semiconductor substrate 202. Another is to route electrical signals between imaging array 208 and surface 321. Yet another function of carrier substrate 304A is to re-distribute the electrical signals to different areas of BSI sensor 300A to maximize the surface area of the chip.

Figure 3B:
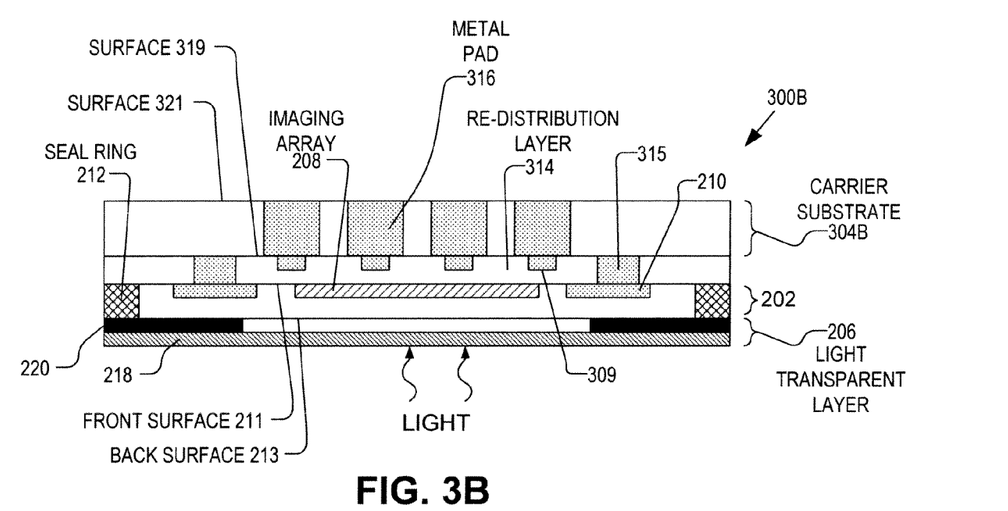
FIG. 3B is a cross-sectional view of a backside illuminated sensor with metal pads formed in a carrier substrate and a re-distribution layer formed on a semiconductor substrate, in accordance with an embodiment of the invention.

FIG. 3B is a cross-sectional view of a backside illuminated sensor 300B with metal pads formed in carrier substrate 304B and re-distribution layer 314 formed on semiconductor substrate 202, in accordance with an embodiment of the invention. Like numerals are used to represent like elements as described above with reference to FIG. 3A.

FIG. 3B illustrates re-distribution layer 314 as formed on the front surface 211 of semiconductor substrate 202. In one embodiment, re-distribution layer 314 is a layer of metal patterned onto semiconductor substrate 202. This layer of metal is illustrated in FIG. 3B as including metal traces 309 and metals pad 215. Metal pads 215 are formed to couple metal traces 309 to peripheral circuitry 210. In one embodiment, metal pads 315 and metal traces 309 are deposited onto semiconductor substrate 202 by way of sputtering, collimated sputtering, low pressure sputtering, reactive sputtering, electroplating, chemical vapor deposition or evaporation.

In the embodiment of FIG. 3B, carrier substrate 304B is illustrated as including metal pads 316 and has a surface 319 that is coupled (through re-distribution layer 314) to the front surface 211 of semiconductor substrate 202 to provide structural support to semiconductor substrate 202. Metal pads 216 are formed in carrier substrate 304B to couple to metal traces 309 and to provide a bonding area for BSI sensor 300B at surface 321. It is noted that the illustrated embodiment of BSI sensor 300B shown in FIG. 3B is not drawn to scale. For example, carrier substrate 304B may have a thickness that is much greater than that of semiconductor substrate 202. By way of example, carrier substrate 304B may be on the order of 100 times thicker than semiconductor substrate 202. In one embodiment, carrier substrate 304B and semiconductor substrate 202 are fabricated separately. In this embodiment, semiconductor substrate 202 is fabricated, then re-distribution layer 314 is formed onto the front surface 211 of semiconductor substrate 202. Carrier substrate 304B is then bonded to the top surface of the re-distribution layer 314 by a method such as press-bonding.

In one embodiment, carrier substrate 304B is an oxide. In another embodiment, carrier substrate 304B is formed from silicon. In this embodiment of a silicon carrier substrate 304B, an insulator such as oxide, nitride or polymer may be fabricated between the metal and silicon. For example, a silicon carrier substrate 304B may include an oxide insulator formed between metal pads 316 and the silicon of carrier substrate 304B.

Figure 4A:
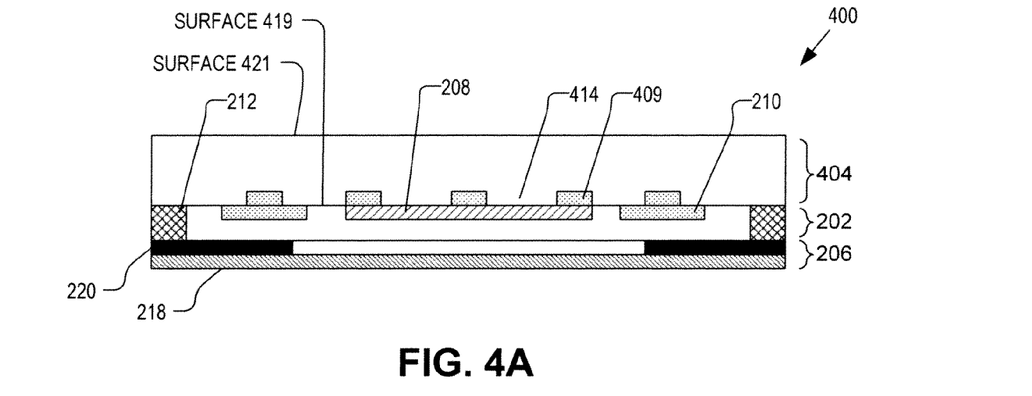
FIGS. 4A-4C illustrate cross-sectional views and a method of making a backside illuminated sensor with a carrier substrate having a re-distribution layer and bump pads, in accordance with an embodiment of the invention.
Figure 4B:
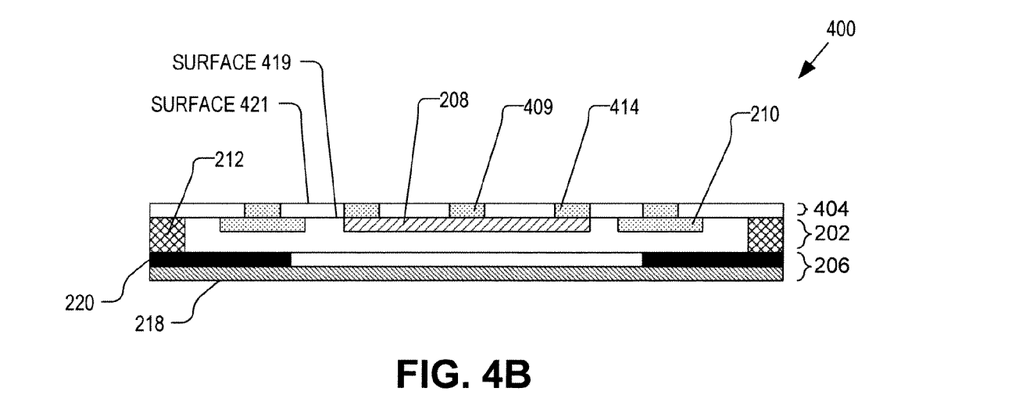
Figure 4C:
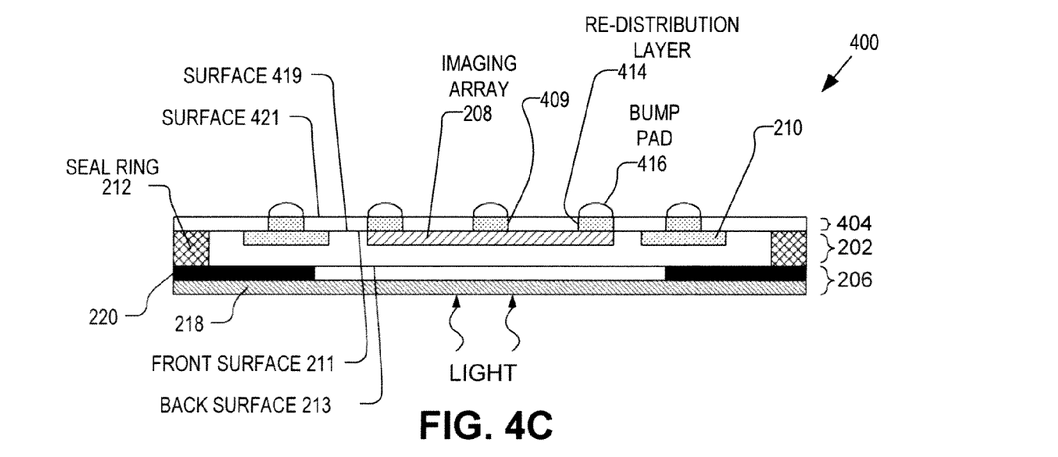

FIGS. 4A-4C illustrate cross-sectional views of a BSI sensor 400 with a carrier substrate 404 having a re-distribution layer 404 and bump pads 416 and a method of making the same, in accordance with an embodiment of the invention. The illustrated embodiment of BSI sensor 400 includes semiconductor substrate 202, carrier substrate 404, and light transparent layer 206. Carrier substrate 404 is illustrated as having a first surface (i.e., surface 419) and a second surface (i.e., surface 421). FIG. 4C also illustrates carrier substrate 404 as including re-distribution layer 414 and bump pads 416.

In the illustrated embodiment of FIG. 4A, carrier substrate 404 has a surface 419 that is coupled to the front surface 211 of semiconductor substrate 202 to provide structural support to semiconductor substrate 202. It is noted that the illustrated embodiments of BSI sensor 400 shown in FIGS. 4A-4C are not drawn to scale. For example, carrier substrate 404 may have a thickness that is much greater than that of semiconductor substrate 202. By way of example, carrier substrate 404 may be on the order of 100 times thicker than semiconductor substrate 202. In one embodiment, carrier substrate 404 and semiconductor substrate 202 are fabricated separately and then bonded together by a method such as press-bonding.

FIG. 4A further illustrates re-distribution layer 414 as formed in carrier substrate 404. One purpose of re-distribution layer 414 is to route electrical signals between imaging array 208 and surface 421 of carrier substrate 404. For example, re-distribution layer 414 may receive image signals from imaging array 208 or peripheral circuitry 210 and route these signals to circuitry external to BSI sensor 400 for display, storage or further processing. In another example, re-distribution layer 414 may receive a control signal or power from external circuitry and route this control signal or power to peripheral circuitry 210 or imaging array 208.

After carrier substrate 404 is bonded with semiconductor substrate 202, surface 421 may be ground down to expose all or a portion of re-distribution layer 414, as shown in FIG. 4B. In one embodiment, re-distribution layer 414 is a layer of metal patterned onto carrier substrate 404. This layer of metal is illustrated in FIG. 4B as including metal traces 409. In one embodiment metal traces 409 are a metal such as tungsten or other alloy. In one embodiment, metal traces 409 are deposited onto carrier substrate 404 prior to the carrier/semiconductor substrate bonding, by way of sputtering, collimated sputtering, low pressure sputtering, reactive sputtering, electroplating, chemical vapor deposition or evaporation.

In one embodiment, carrier substrate 404 is an oxide. In another embodiment, carrier substrate 404 is formed from silicon. In this embodiment of a silicon carrier substrate 404, an insulator such as oxide, nitride or polymer may be fabricated between the metal and silicon. For example, a silicon carrier substrate 404 may include an oxide insulator formed between metal traces 409 and the silicon of carrier substrate 404.

In FIG. 4C, bump pads 409 are formed on surface 421 of carrier substrate 404 to couple to metal traces 409 and to provide a bonding area for BSI sensor 400.

Thus, the carrier substrate 404, illustrated in the embodiment of FIG. 4C may provide several functions for BSI sensor 400. One function of carrier substrate 404 is to provide structural support to semiconductor substrate 202. Another is to route electrical signals between imaging array 208 and surface 421. Yet another function of carrier substrate 404 is to re-distribute the electrical signals to different areas of BSI sensor 400 to maximize the surface area of the chip.

Figure 5:
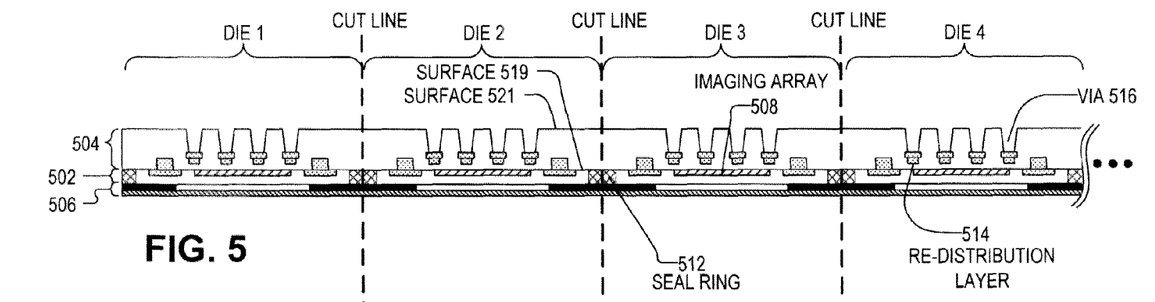
FIG. 5 is a cross-sectional view of a wafer-level packaging of multiple dies of backside illuminated sensors with a carrier wafer having a re-distribution layer and vias, in accordance with an embodiment of the invention.

FIG. 5 is a cross-sectional view of a wafer-level packaging of multiple dies of backside illuminated sensors with a carrier wafer 504 having a re-distribution layer 514 and vias 516, in accordance with an embodiment of the invention. In one embodiment, FIG. 5 represents one possible implementation of wafer-level packaging of multiple BSI sensors 200A. The illustrated embodiment of a wafer-level packaging including multiple dice (e.g., DIE 1, DIE 2, etc.), as shown in FIG. 5, includes a backside illuminated wafer 502, a carrier wafer 504, and an optional glass cover 506. Carrier wafer 504 is illustrated as having a first surface (i.e., surface 519) and a second surface (i.e., surface 521). FIG. 5 also shows carrier wafer 504 as including re-distribution layer 514 and vias 516.

Figure 6:
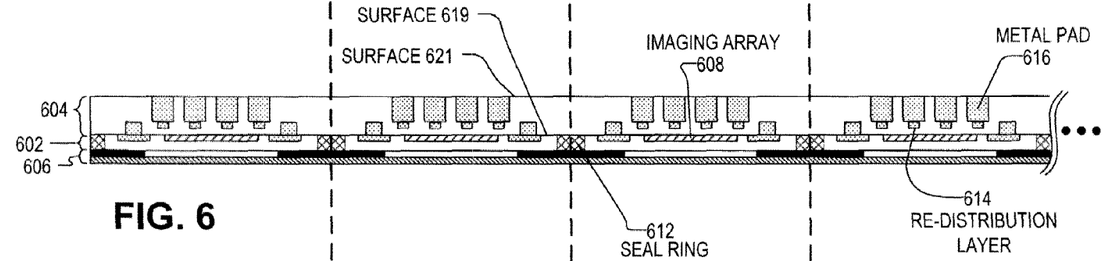
FIG. 6 is a cross-sectional view of a wafer-level packaging of multiple dies of backside illuminated sensors with a carrier wafer having a re-distribution layer and metal pads, in accordance with an embodiment of the invention.

FIG. 6 is a cross-sectional view of a wafer-level packaging of multiple dies of backside illuminated sensors with a carrier wafer 604 having a re-distribution layer 614 and metal pads 616, in accordance with an embodiment of the invention. In one embodiment, FIG. 6 represents one possible implementation of wafer-level packaging of multiple BSI sensors 300A. The illustrated embodiment of a wafer-level packaging including multiple dice (e.g., DIE 1, DIE 2, etc.), as shown in FIG. 6 includes a backside illuminated wafer 602, a carrier wafer 604, and an optional glass cover 606. Carrier wafer 604 is illustrated as having a first surface (i.e., surface 619) and a second surface (i.e., surface 621). FIG. 6 also shows carrier wafer 604 as including re-distribution layer 614 and metal pads 516.

Figure 7:
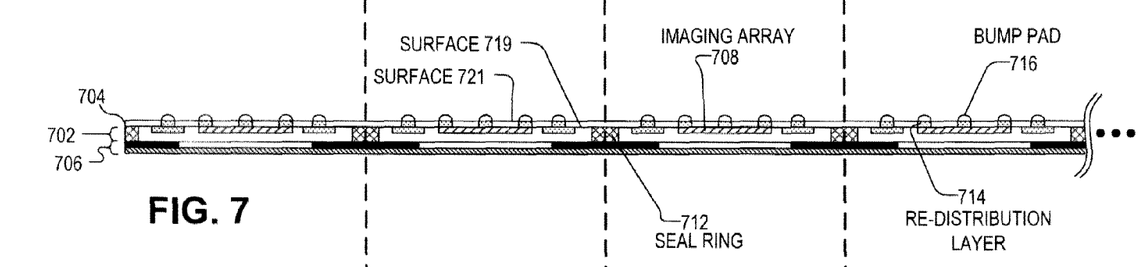
FIG. 7 is a cross-sectional view of a wafer-level packaging of multiple dies of backside illuminated sensors with a carrier wafer having a re-distribution layer and bump pads, in accordance with an embodiment of the invention.

FIG. 7 is a cross-sectional view of a wafer-level packaging of multiple dies of backside illuminated sensors with a carrier wafer 704 having a re-distribution layer 714 and bump pads 716, in accordance with an embodiment of the invention. In one embodiment, FIG. 7 represents one possible implementation of wafer-level packaging of multiple BSI sensors 400. The illustrated embodiment of a wafer-level packaging including multiple dice (e.g., DIE 1, DIE 2, etc.), as shown in FIG. 7 includes a backside illuminated wafer 702, a carrier wafer 704, and an optional glass cover 706. Carrier wafer 704 is illustrated as having a first surface (i.e., surface 719) and a second surface (i.e., surface 721). FIG. 7 also shows carrier wafer 704 as including re-distribution layer 714 and bump pads 716.

As shown in FIGS. 5, 6 and 7, each wafer-level packaging includes a plurality of seal rings (e.g., 512, 612 and 712). In one embodiment, the semiconductor dice are separated from one another by no more than one seal ring. The use of only a single seal ring to separate semiconductor die may reduce the wafer size and/or increase the number of dice that may be fabricated on each wafer, as compared with prior art techniques, such as that described in FIGS. 1A-1E. Furthermore, the use of a carrier wafer having a built-in re-distribution layer reduces the need for further processing once the dice are separated. For example, in one embodiment, once the semiconductor dice of FIGS. 5, 6 and 7 are separated from one another they may be immediately ready for placement into a socket or other mounting device.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated imaging sensor, comprising:
a semiconductor substrate having a front surface and a back surface, the semiconductor substrate having at least one imaging array and peripheral circuitry of the imaging array formed on the front surface of the semiconductor substrate;
a carrier substrate to provide structural support to the semiconductor substrate, the carrier substrate having a material that extends between a first surface and a second surface of the carrier substrate, wherein the first surface of the carrier substrate is bonded to the front surface of the semiconductor substrate, such that the first surface is in direct contact with the front surface; and
a re-distribution layer formed in the carrier substrate, wherein the redistribution layer provides a bonding area for the imaging sensor at the second surface of the carrier substrate and routes electrical signals between the peripheral circuitry and the bonding area to transform off-chip connections of the semiconductor substrate from chip scale to board scale, wherein the re-distribution layer comprises a metal trace, a first metal pad, and a second metal pad, wherein the first metal pad is disposed in the carrier substrate at the first surface to couple the metal trace to the peripheral circuitry, and wherein the second metal pad is disposed in the carrier substrate at the second surface coupled to the metal trace to provide the bonding area.

2. The imaging sensor of claim 1, wherein the imaging array is a CMOS imaging array.

3. The imaging sensor of claim 1, wherein the metal trace is configured to distribute the electrical signals to an area at least partially above the imaging array and between the front surface of the imaging array and the second surface of the carrier substrate.

4. The imaging sensor of claim 1, wherein the carrier substrate has a thickness greater than a thickness of the semiconductor substrate.

5. The imaging sensor of claim 1, wherein the carrier substrate is press-bonded to the front surface of the semiconductor substrate.

6. The imaging sensor of claim 1, wherein the material is an oxide.

7. The imaging sensor of claim 1, wherein the material is silicon.

8. The imaging sensor of claim 1, wherein the bonding area is disposed above the imaging array and wherein the peripheral circuitry is laterally disposed from the imaging array.

* * * * *